US007303427B2

(12) United States Patent
Swain

(10) Patent No.: US 7,303,427 B2
(45) Date of Patent: Dec. 4, 2007

(54) ELECTRICAL CONNECTOR WITH AIR-CIRCULATION FEATURES

(75) Inventor: Wilfred J. Swain, Mechanicsburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/303,657

(22) Filed: Dec. 16, 2005

(65) Prior Publication Data

US 2006/0223362 A1 Oct. 5, 2006

Related U.S. Application Data

(60) Provisional application No. 60/668,350, filed on Apr. 5, 2005.

(51) Int. Cl.
*H01R 13/00* (2006.01)
*H05K 7/20* (2006.01)

(52) U.S. Cl. ...................................... 439/487; 361/694

(58) Field of Classification Search ................ 439/487, 439/884, 63, 79, 607, 608; 361/690, 694
See application file for complete search history.

(56) References Cited

U.S. PATENT DOCUMENTS

| | | | | |
|---|---|---|---|---|
| 3,286,220 | A | 11/1966 | Marley et al. | 439/680 |
| 3,538,486 | A | 11/1970 | Shlesinger, Jr. | 439/268 |
| 3,669,054 | A | 6/1972 | Desso et al. | 113/119 |
| 3,748,633 | A | 7/1973 | Lundergan | 339/217 |
| 3,871,015 | A | 3/1975 | Lin et al. | 357/67 |
| 4,076,362 | A | 2/1978 | Ichimura | 339/75 |
| 4,159,861 | A | 7/1979 | Anhalt | 339/75 |
| 4,217,024 | A | 8/1980 | Aldridge et al. | 339/275 |
| 4,260,212 | A | 4/1981 | Ritchie et al. | 339/97 |
| 4,288,139 | A | 9/1981 | Cobaugh et al. | 339/74 |
| 4,371,912 | A | 2/1983 | Guzik | 361/417 |
| 4,383,724 | A | 5/1983 | Verhoeven | 439/510 |
| 4,402,563 | A | 9/1983 | Sinclair | 339/75 |
| 4,505,529 | A | 3/1985 | Barkus | 439/82 |
| 4,536,955 | A | 8/1985 | Gudgeon | 29/840 |
| 4,545,610 | A | 10/1985 | Lakritz et al. | 29/589 |
| 4,560,222 | A | 12/1985 | Dambach | 339/75 |
| 4,717,360 | A | 1/1988 | Czaja | 439/710 |
| 4,767,344 | A | 8/1988 | Noschese | 439/83 |
| 4,776,803 | A | 10/1988 | Pretchel et al. | 439/59 |
| 4,815,987 | A | 3/1989 | Kawano et al. | 439/263 |
| 4,867,713 | A | 9/1989 | Ozu et al. | 439/833 |
| 4,878,611 | A | 11/1989 | LoVasco et al. | 228/180.2 |
| 4,900,271 | A | 2/1990 | Colleran et al. | 439/595 |
| 4,907,990 | A | 3/1990 | Bertho et al. | 439/851 |
| 4,973,271 | A | 11/1990 | Ishizuka et al. | 439/839 |
| 5,077,893 | A | 1/1992 | Mosquera et al. | 29/882 |

(Continued)

FOREIGN PATENT DOCUMENTS

| | | |
|---|---|---|
| EP | 0 273 683 A2 | 7/1988 |

(Continued)

*Primary Examiner*—Chandrika Prasad
(74) *Attorney, Agent, or Firm*—Woodcock Washburn LLP

(57) ABSTRACT

A preferred embodiment of an electrical connector includes an electrical conductor for transmitting electrical power, and a housing. The electrical conductor is mounted in the housing so that the housing and the electrical conductor define a channel for circulating airflow through the housing and along a surface of the electrical conductor.

23 Claims, 5 Drawing Sheets

U.S. PATENT DOCUMENTS

| | | | | |
|---|---|---|---|---|
| 5,174,770 | A | 12/1992 | Sasaki et al. | 439/108 |
| 5,214,308 | A | 5/1993 | Nishiguchi | 257/692 |
| 5,238,414 | A | 8/1993 | Yaegashi et al. | 439/108 |
| 5,254,012 | A | 10/1993 | Wang | 439/263 |
| 5,274,918 | A | 1/1994 | Reed | 29/882 |
| 5,302,135 | A | 4/1994 | Lee | 439/263 |
| 5,400,949 | A | 3/1995 | Hirvonen et al. | 228/180.22 |
| 5,431,578 | A | 7/1995 | Wayne | 439/259 |
| 5,475,922 | A | 12/1995 | Tamura et al. | 29/881 |
| 5,490,040 | A | 2/1996 | Gavdenzi et al. | 361/773 |
| 5,558,542 | A | 9/1996 | O'Sullivan et al. | 439/682 |
| 5,590,463 | A | 1/1997 | Feldman et al. | 29/844 |
| 5,609,502 | A | 3/1997 | Thumma | 439/747 |
| 5,637,008 | A | 6/1997 | Kozel | 439/342 |
| 5,691,041 | A | 11/1997 | Frankeny et al. | 428/209 |
| 5,702,255 | A | 12/1997 | Murphy et al. | 439/71 |
| 5,730,609 | A | 3/1998 | Harwath | 439/108 |
| 5,741,144 | A | 4/1998 | Elco et al. | 439/101 |
| 5,741,161 | A | 4/1998 | Cahaly et al. | 439/709 |
| 5,742,484 | A | 4/1998 | Gillette et al. | 361/789 |
| 5,743,009 | A | 4/1998 | Matsui et al. | 29/843 |
| 5,745,349 | A | 4/1998 | Lemke | 361/818 |
| 5,746,608 | A | 5/1998 | Taylor | 439/70 |
| 5,755,595 | A | 5/1998 | Davis et al. | 439/607 |
| 5,795,191 | A | 8/1998 | Preputnick et al. | 439/608 |
| 5,810,607 | A | 9/1998 | Shih et al. | 439/66 |
| 5,817,973 | A | 10/1998 | Elco | 174/32 |
| 5,874,776 | A | 2/1999 | Kresge et al. | 257/747 |
| 5,876,219 | A | 3/1999 | Taylor et al. | 439/74 |
| 5,883,782 | A | 3/1999 | Thurston et al. | 364/704 |
| 5,888,884 | A | 3/1999 | Wojnarowski | 438/462 |
| 5,908,333 | A | 6/1999 | Perino et al. | 439/631 |
| 5,919,050 | A | 7/1999 | Kehley et al. | 439/71 |
| 5,930,114 | A | 7/1999 | Kuzmin et al. | 361/704 |
| 5,955,888 | A | 9/1999 | Frederickson et al. | 324/761 |
| 5,961,355 | A | 10/1999 | Morlion et al. | 439/686 |
| 5,971,817 | A | 10/1999 | Longueville | 439/857 |
| 5,975,921 | A | 11/1999 | Shuey | 439/83 |
| 5,980,321 | A | 11/1999 | Cohen et al. | 439/608 |
| 5,984,726 | A | 11/1999 | Wu | 439/607 |
| 5,993,259 | A | 11/1999 | Stokoe et al. | 439/608 |
| 6,012,948 | A | 1/2000 | Wu | 439/567 |
| 6,050,862 | A | 4/2000 | Ishii | 439/843 |
| 6,059,170 | A | 5/2000 | Jimarez et al. | 228/119 |
| 6,068,520 | A | 5/2000 | Winings et al. | 439/676 |
| 6,089,878 | A | 7/2000 | Meng | 439/79 |
| 6,095,827 | A | 8/2000 | Dutkowsky et al. | 439/83 |
| 6,123,554 | A | 9/2000 | Ortega et al. | 439/79 |
| 6,125,535 | A | 10/2000 | Chiou et al. | 29/883 |
| 6,139,336 | A | 10/2000 | Olson | 439/83 |
| 6,146,157 | A | 11/2000 | Lenoir et al. | 439/101 |
| 6,146,203 | A | 11/2000 | Elco et al. | 439/608 |
| 6,152,756 | A | 11/2000 | Huang et al. | 439/342 |
| 6,174,198 | B1 | 1/2001 | Wu et al. | 439/541.5 |
| 6,180,891 | B1 | 1/2001 | Murdeshwar | 174/260 |
| 6,183,301 | B1 | 2/2001 | Paagman | 439/608 |
| 6,190,213 | B1 | 2/2001 | Reichart et al. | 439/736 |
| 6,196,871 | B1 | 3/2001 | Szu | 439/571 |
| 6,202,916 | B1 | 3/2001 | Updike et al. | 228/180 |
| 6,210,197 | B1 | 4/2001 | Yu | 439/342 |
| 6,212,755 | B1 | 4/2001 | Shimada et al. | 29/527.1 |
| 6,215,180 | B1 | 4/2001 | Chen et al. | 257/720 |
| 6,219,913 | B1 | 4/2001 | Uchiyama | 29/883 |
| 6,220,884 | B1 | 4/2001 | Lin | 439/342 |
| 6,220,895 | B1 | 4/2001 | Lin | 439/607 |
| 6,220,896 | B1 | 4/2001 | Bertoncini et al. | 439/608 |
| 6,257,478 | B1 | 7/2001 | Straub | 228/6.2 |
| 6,259,039 | B1 | 7/2001 | Chroneos, Jr. et al. | 174/263 |
| 6,269,539 | B1 | 8/2001 | Takahashi et al. | 29/883 |
| 6,274,474 | B1 | 8/2001 | Caletka et al. | 438/613 |
| 6,293,827 | B1 | 9/2001 | Stokoe | 439/608 |
| 6,299,492 | B1 * | 10/2001 | Pierini et al. | 439/884 |
| 6,319,075 | B1 | 11/2001 | Clark et al. | 439/825 |
| 6,328,602 | B1 | 12/2001 | Yamasaki et al. | 439/608 |
| 6,347,952 | B1 | 2/2002 | Hasegawa et al. | 439/608 |
| 6,350,134 | B1 | 2/2002 | Fogg et al. | 439/79 |
| 6,360,940 | B1 | 3/2002 | Bolde et al. | 228/264 |
| 6,363,607 | B1 | 4/2002 | Chen et al. | 29/883 |
| 6,371,773 | B1 | 4/2002 | Crofoot et al. | 439/79 |
| 6,379,188 | B1 | 4/2002 | Cohen et al. | 439/608 |
| 6,409,543 | B1 | 6/2002 | Astbury, Jr. et al. | 439/608 |
| 6,431,914 | B1 | 8/2002 | Billman | 439/608 |
| 6,435,914 | B1 | 8/2002 | Billman | 439/608 |
| 6,461,202 | B2 | 10/2002 | Kline | 439/701 |
| 6,471,523 | B1 * | 10/2002 | Shuey | 439/63 |
| 6,471,548 | B2 | 10/2002 | Bertoncini et al. | 439/608 |
| 6,506,081 | B2 | 1/2003 | Blanchfield et al. | 439/682 |
| 6,514,103 | B2 | 2/2003 | Pape et al. | 439/608 |
| 6,537,111 | B2 | 3/2003 | Brammer et al. | 439/857 |
| 6,544,046 | B1 | 4/2003 | Hahn et al. | 439/83 |
| 6,551,112 | B1 | 4/2003 | Li et al. | 439/66 |
| 6,554,647 | B1 | 4/2003 | Cohen et al. | 439/607 |
| 6,572,410 | B1 | 6/2003 | Volstorf et al. | 439/608 |
| 6,652,318 | B1 | 11/2003 | Winings et al. | 439/608 |
| 6,663,426 | B2 | 12/2003 | Fedder et al. | 439/608 |
| 6,672,907 | B2 | 1/2004 | Azuma | 439/682 |
| 6,692,272 | B2 | 2/2004 | Lemke et al. | 439/108 |
| 6,702,594 | B2 | 3/2004 | Lee et al. | 439/83 |
| 6,740,820 | B2 | 5/2004 | Cheng | 174/260 |
| 6,743,037 | B2 | 6/2004 | Kassa et al. | 439/342 |
| 6,746,278 | B2 | 6/2004 | Nelson et al. | 439/608 |
| 6,796,831 | B1 * | 9/2004 | Yasufuku et al. | 439/485 |
| 6,869,294 | B2 * | 3/2005 | Clark et al. | 439/79 |
| 7,001,189 | B1 * | 2/2006 | McGowan et al. | 439/79 |
| 2003/0013330 | A1 | 1/2003 | Takeuchi | 439/83 |
| 2003/0143894 | A1 | 7/2003 | Kline et al. | 439/608 |
| 2003/0220021 | A1 | 11/2003 | Whiteman, Jr. et al. | 439/608 |
| 2004/0183094 | A1 | 9/2004 | Caletka et al. | 257/178 |
| 2006/0003620 | A1 | 1/2006 | Daily et al. | 439/295 |

FOREIGN PATENT DOCUMENTS

| | | |
|---|---|---|
| EP | 0 789 422 A2 | 8/1997 |
| JP | 06-236788 | 8/1994 |
| JP | 07-114958 | 5/1995 |
| JP | 0 812 5379 | 5/1996 |
| JP | 2000-003743 | 1/2000 |
| JP | 2000-003744 | 1/2000 |
| JP | 2000-003745 | 1/2000 |
| JP | 2000-003746 | 1/2000 |
| WO | WO 97/43885 | 11/1997 |
| WO | WO 97/44859 | 11/1997 |
| WO | WO 98/15989 | 4/1998 |
| WO | WO 01/29931 A1 | 4/2001 |
| WO | WO 01/39332 A1 | 5/2001 |

* cited by examiner

ELECTRICAL CONNECTOR WITH AIR-CIRCULATION FEATURES

CROSS REFERENCE TO RELATED APPLICATIONS

This application claims priority under 35 U.S.C. § 119(e) to U.S. provisional application No. 60/668,350, filed Apr. 5, 2005, the contents of which is incorporated by reference herein in its entirety. This application is related to U.S. application Ser. No. 11/255,295, filed Oct. 20, 2005, which claims priority under 35 U.S.C. § 119(e) to U.S. provisional application No. 60/638,470, filed Dec. 22, 2004; and U.S. application Ser. No. 11/284,154, filed Nov. 21, 2005, which claims priority under 35 U.S.C. § 119(e) to U.S. provisional application No. 60/648,651, filed Jan. 31, 2005. The contents of each of the above-referenced applications is incorporated by reference herein in its entirety.

FIELD OF THE INVENTION

The present invention relates generally to electrical connectors. More specifically, the invention relates to a connector for transmitting electrical power and having features that permit air to circulate through the connector.

BACKGROUND OF THE INVENTION

Electrical connectors typically become heated during operation due the flow of electrical current therethrough. The heating of connectors used to transmit power can be substantial, due to the relatively high currents typically associated with power transmission.

Connectors used to transmit power can include one or more electrically-conductive plates or blades disposed in an electrically-insulating housing. The plates or blades can be relatively large, and may require lateral support in the form of ribs or like structure formed in the housing. The support ribs typically contact multiple locations on the plate or blade.

The support ribs, and other structure within the housing, can inhibit circulation of air within the housing, and can form pockets of trapped air in direct contact with the conductor. The air and the housing are thermally insulating. Hence, the presence of stagnant air within the housing can allow heat to build up within the connector, and cause the connector to operate at relatively high temperatures.

Excessive heating of a connector can limit the amount of power that can be transmitted through the connector. Moreover, operating a connector at high temperatures can potentially reduce the reliability and service life of the connector. Moreover, high operating temperatures may require that the connector be spaced from other components by a greater distance than otherwise would be required, i.e., high operating temperatures can increase the overall footprint of a connector.

SUMMARY OF THE INVENTION

To help solve the problem of excessive heating of electrical connectors used to transmit power, the present invention is directed to an electrical connector comprising an electrical conductor for transmitting electrical power, and a housing. The electrical conductor is mounted in the housing so that the housing and the electrical conductor define a channel for circulating airflow through the housing and along a surface of the electrical conductor.

Another preferred embodiment of an electrical connector comprises an electrical conductor for conducting electrical power. The electrical conductor comprises a major portion, a tail extending from the major portion for establishing electrical contact with a substrate, and a contact beam extending from the major portion. The connector also comprises a housing defining a cavity for receiving the major portion so that the tail extends from a bottom of the housing. The cavity is in fluid communication with the ambient environment by way of openings defined in the bottom and a top of housing so that ambient air can circulate over the major portion in response to heating of the electrical conductor.

BRIEF DESCRIPTION OF THE DRAWINGS

The foregoing summary, as well as the following detailed description of a preferred embodiment, are better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings.

DETAILED DESCRIPTION OF ILLUSTRATIVE EMBODIMENTS

FIGS. 1 to 5 depict a preferred embodiment of an electrical connector 10. The figures a each referenced to a common coordinate system 11. Directional terms such as "top," bottom," "vertical," horizontal," "above," "below," etc., are used herein with reference to the component orientations depicted in FIG. 5. These terms are used for exemplary purposes only, and are not intended to limit the scope of the appended claims.

Figure 5:
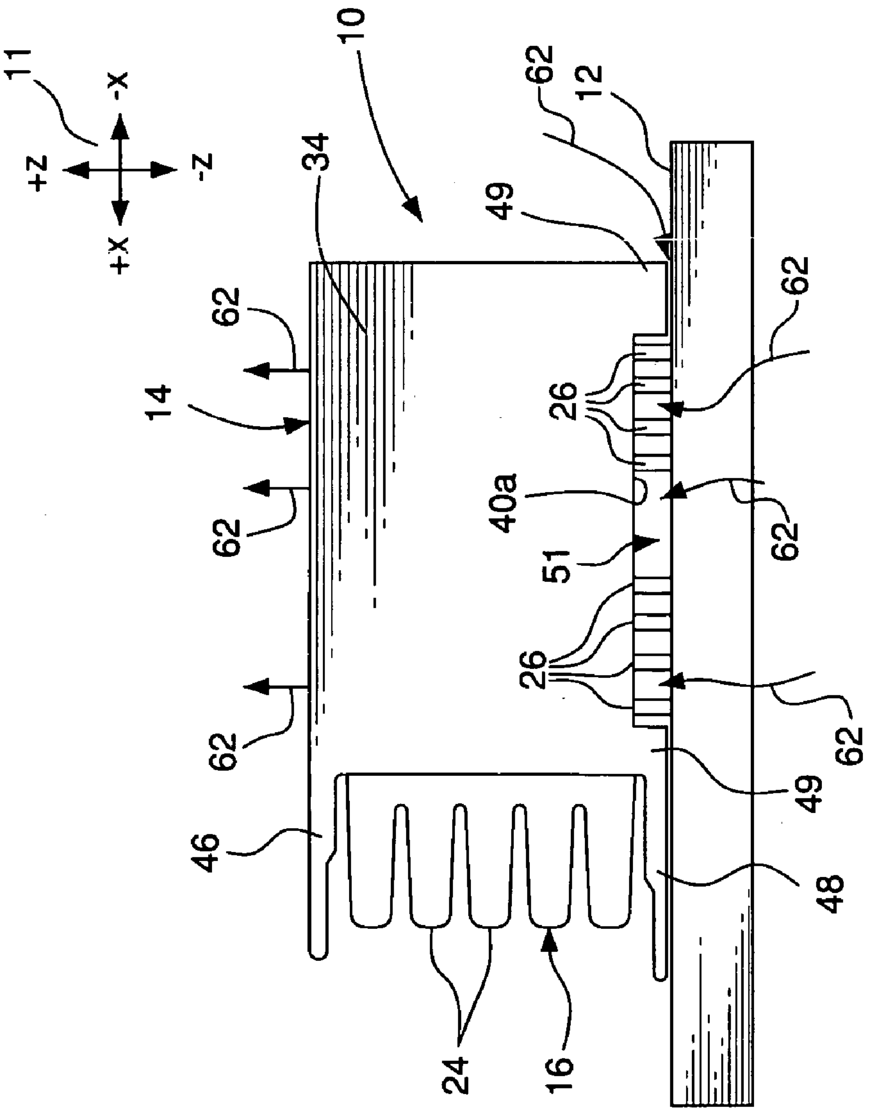
FIG. 5 is a side view of the electrical connector shown in FIGS. 1-4, mounted on a substrate.

The connector 10 can be mounted on a substrate 12, as depicted in FIG. 5. The connector 10 comprises a housing 14. The connector 10 also comprises a first conductor 16 and a second conductor 18 mounted in the housing 14.

The first conductor 16 and the second conductor 18 are substantially identical, with the exception that the first and second conductors 16, 18 are configured in a left and right hand configuration. In other words, the first and second conductors 16, 18 are symmetrically disposed about a vertically-oriented plane passing through the center of the connector 10. Alternative embodiments of the electrical connector 10 can include conductors that are not substantially identical, and are not symmetrically disposed in the above-noted manner.

The first and second conductors 16, 18 each comprise a major portion in the form of a substantially flat plate 20. The first and second conductors 16, 18 are mounted in the housing 14 so that the plates 20 of the first and second conductors 16, 18 abut, as depicted in FIGS. 1-4.

Each of the first and second conductors 16, 18 also comprises a plurality of contact beams 24 extending from a forward edge of the corresponding plate 20, for mating with a contact, such as a contact blade, of another electrical device such as a second electrical connector (not shown).

Figure 1:
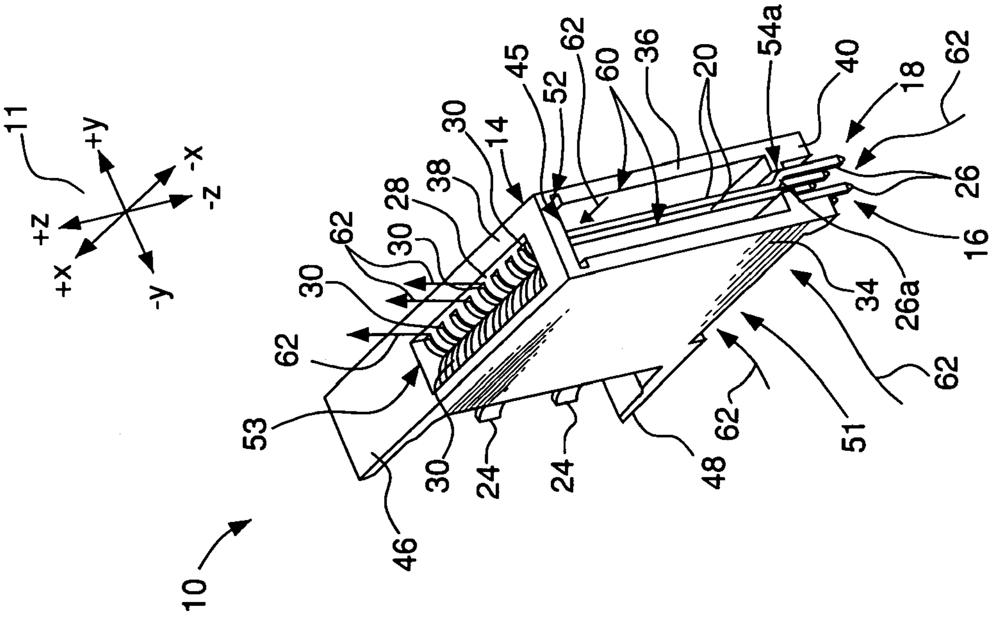
FIG. 1 is a rear perspective view of a preferred embodiment of an electrical connector.
Figure 3:
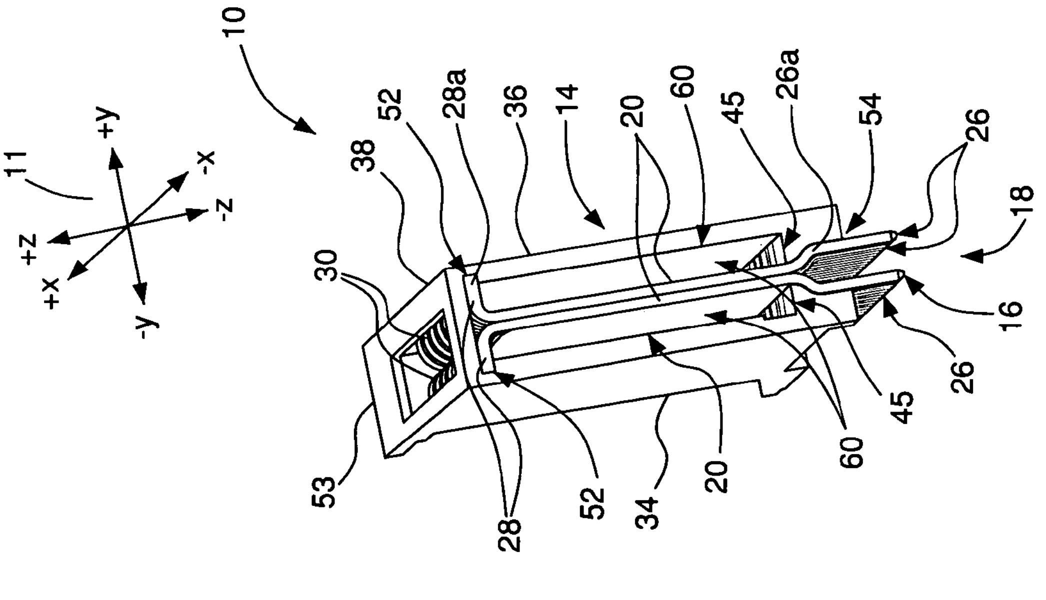
FIG. 3 is another rear perspective view of the electrical connector shown in FIGS. 1 and 2.
Figure 6:
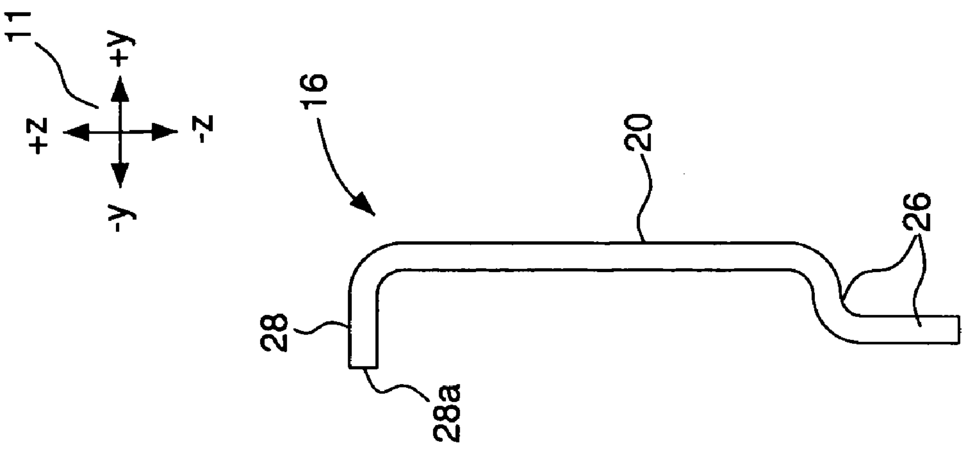
FIG. 6 is a rear view of a conductor of the electrical connector shown in FIGS. 1-5.

Each of the first and second conductors 16, 18 also comprises a plurality of solder tails 26 extending from a bottom edge of the corresponding plate 20, for mounting the connector 10 on the substrate 12. Each solder tail 26 includes a substantially S-shaped portion 26*a* that adjoins the corresponding plate 20. The portion 26*a* offsets the remainder of the contact 26 from the corresponding plate 20, as shown in FIGS. 1 and 3. Alternative embodiments can include press-fit tails, or other types of tails in lieu of the solder tails 26.

The first and second conductors 16, 18 can conduct power between the substrate 12 and the second electrical connector when the connector 10 is mounted on the substrate 12 and mated with the second electrical connector.

Each plate 20 includes a curved portion 28. Each of the curved portions 28 forms an upper end of the corresponding first or second conductor 16, 18, and extends through an arc of approximately ninety degrees. The tops of the first and second conductors 16, 18 thus flare outward as shown, for example, in FIG. 3.

The curved portions 28 each have a continuous outer edge 28*a*, as shown in FIG. 3. Alternative embodiments of the first and second conductors 16, 18 can include outer edges that are not continuous. Each curved portion 28 has a plurality of perforations, or slots 30 formed therein. The slots 30 preferably extend between a first position proximate the corresponding plate 20, and a second position proximate the corresponding outer edge 28*a* as shown, for example, in FIG. 1.

Figure 4:
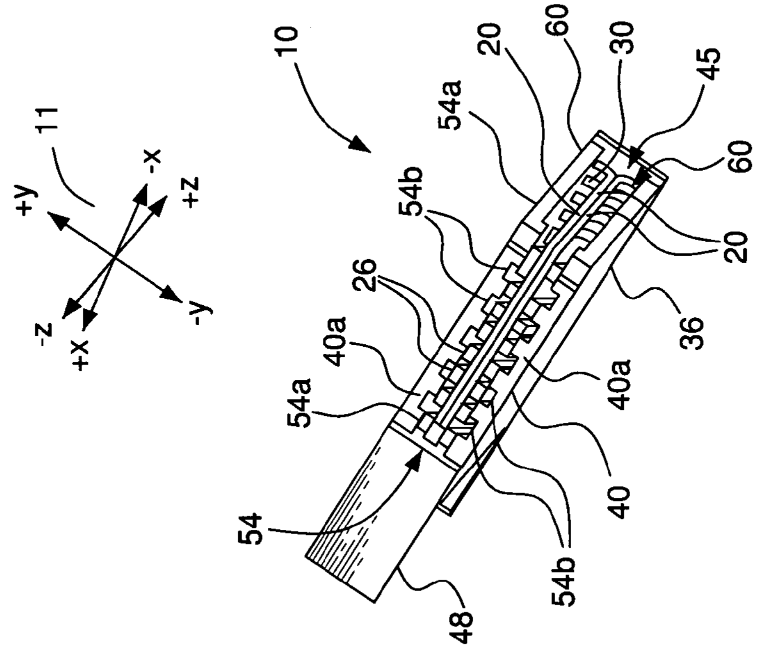
FIG. 4 is a bottom perspective view of the electrical connector shown in FIGS. 1-3.

The housing 14 is formed from an electrically-insulating material such as plastic. The housing 14 includes a first side portion 34, a second side portion 36, a top portion 38, and a bottom portion 40. The top and bottom portions 38, 40 each adjoin the first and second side portions 34, 36. The first side portion 34, second side portion 36, top portion 38, and bottom portion 40 define a cavity 45 within the housing 14, as shown in FIGS. 1, 3, and 4. The forward and rearward ends of the cavity 45 are open, to facilitate insertion of the first and second conductors 16, 18.

The housing 14 also includes an upper mating shroud 46 extending from the top portion 38 of the housing 14, and a lower mating shroud 48 extending from the bottom portion 40. The housing 14 further includes standoffs 49 that cause the bottom portion 40 of the housing 14 to be spaced from the substrate 12, as shown in FIG. 5. In other words, a gap 51 exists between a bottom surface 40*a* of the bottom portion 40 and the substrate 12 when the connector 10 is mounted on the substrate 12.

The first side portion 34 and the top portion 38 define a retaining feature in the form of a slot, or groove 52, as shown in FIGS. 1 and 3. The second side portion 36 and the top portion 38 define another of the grooves 52. The grooves 52 each extend longitudinally, i.e., in the "x" direction.

Figure 2:
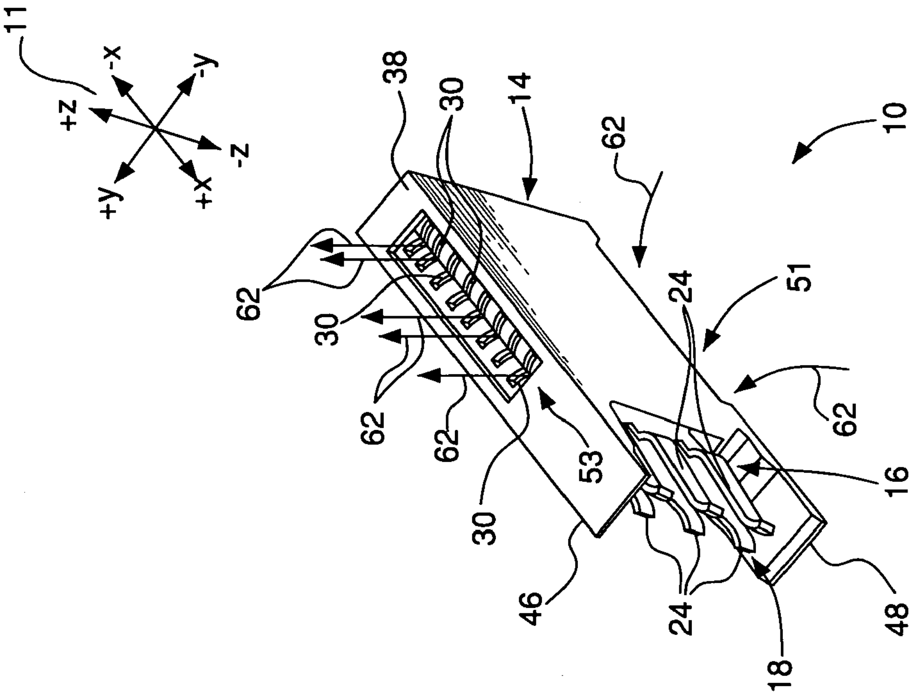
FIG. 2 is a front perspective view of the electrical connector shown in FIG. 1.

The top portion 38 has an opening 53 formed therein, as shown in FIGS. 1 to 3. The opening 53 extends longitudinally, between a first position proximate the rearward end of the top portion 38, and a second position proximate the forward end of the top portion 38.

The bottom portion 40 has an opening 54 formed therein, as shown in FIG. 4. The opening 54 has a center portion 54*a* that extends longitudinally, between the forward and rearward ends of the bottom portion 40. Preferably, the portion of the housing 14 that defines the center portion 54*a* is contoured to substantially match the shape of the solder tails 26, as shown in FIG. 1. The upper end of the center portion 54*a* therefore is relatively narrow, while the bottom end is relatively wide.

The opening 54 also includes side portions 54*b*. Each of the side portions 54*b* adjoins the center portion 54*a*, and extends in the lateral ("y") direction, as shown in FIG. 4.

The first and second conductors 16, 18 are inserted into the housing 14 from the rearward end thereof, i.e., the first and second conductors 16, 18 are inserted into the housing 14 in the "+x" direction.

The plates 20 of the first and second conductors 16, 18 become disposed in the cavity 45 as the first and second conductors 16, 18 are inserted into the housing 14. Moreover, the outer edges 28*a* of the curved portions 28 of the first and second conductors 16, 18 each enter a respective one of the grooves 52 as the first and second conductors 16, 18 are inserted. The grooves 52 help to guide the first and second conductors 16, 18 into the housing 14. The solder tails 24 are accommodated by the center portion 54*a* of the opening 54 as the first and second conductors 16, 18 are inserted.

The grooves 52 are sized so that the outer edge 28*a* of the associated curved portion 28 fits snugly therein. This feature helps to retain the first and second conductors 16, 18 in the housing 14, i.e., the noted feature can help prevent the first and second conductors 16, 18 from backing out of the housing 14. The engagement of the outer edges 28*a* by the housing 14 also helps to restrain the first and second conductors 16, 18 laterally and vertically in relation to the housing 14.

The solder tails 26 extend downward from the housing 14 when the first and second conductors 14, 16 are positioned within the housing 14. The solder tails 26 are received in through holes formed in the substrate 12, and establish electrical contact between the connector 10 and the substrate 12.

The connector 10 includes features that can facilitate circulation of air through the connector 10. These features thereby help to cool the connector 10, and prevent heated air from being trapped within the connector 10. In particular, the first side portion 34 of the housing 14 and the plate 20 of the first conductor 16 define a channel 60 that extends between the top and bottom portions 38, 40, as shown in FIGS. 1, 3, and 4. The second side portion 36 of the housing 14 and the plate 20 of the second conductor 18 define another channel 60 that extends between the top and bottom portions 38, 40. The channels 60 permit air to circulate within the housing 14, between the top and bottom portions 38, 40 thereof.

The engagement of the curved portions 28 of the first and second conductors 16, 18 by the housing 14 helps to laterally restrain the first and second conductors 16, 18 in relation to the housing 14, as noted above. Hence, the connector 10 does not require horizontal support ribs or similar structure that provides lateral restraint by engaging the plates 20 at or near the mid-point thereof. This configuration permits the use of features, such as the channels 60, that form a substantially unobstructed airflow path extending between the top and bottom portions 38, 40 of the housing 14.

The channels 60, in conjunction with the openings 53, 54 in the respective top and bottom portions 38, 40, facilitate circulation of air through the connector 10. In particular, the channels 60 adjoin the opening 53 formed in the top portion 38 of the housing 14. The curved portions 28 of the first and second conductors 16, 18 are located directly below the opening 53. Air therefore can pass into or out of the channels 60 by way of the opening 53, and the slots 30 formed in the curved portions 28.

The channels 60 also adjoin the opening 54 formed in the bottom portion 40 of the housing 14. The bottom surface 40*a* of the bottom portion 40 of the housing 14 is spaced from the substrate 12 by the gap 51, as noted above. The gap 51 permits air to flow into or out of the channels 60 by way of the opening 54. The side portions 54*b* of the opening 54 are not obstructed by the first or second contacts 16, 18. The gap 51 and the side portions 54*b* therefore provide a substantially unobstructed path for air to enter or exit the bottom of each channel 60.

Each of the channels 60 is bounded, in part, by the plate 20 of one of the first and second conductors 16, 18. During operation of the connector 10, the first and second conductors 16, 18 are heated by the flow of electrical current therethrough. The resulting temperature rise in the plates 20 heats the air within the corresponding channels 60.

The heating of the air within the channels 60 is believed to induce airflow through the connector 10. The airflow pattern is denoted diagrammatically by the arrows 62 in the figures. It should be noted that the arrows 62 are included for illustrative purposes only, and are not intended to fully represent the relatively complex airflow patterns that may actually exist in and around the connector 10.

As shown, for example, in FIG. 3, the air heated by the plates 20 is believed to rise within the channels 60. The rising air can exit the channels 60 by way of the slots 30 formed in the curved portions 28 of the first and second conductors 16, 18, and the opening 53 formed in the top portion 38 of the housing 14. Relatively cool ambient air can enter the channels 60 from below by way of the gap 51 and the opening 54 formed in the bottom portion 40 of the housing 14. The cool air replaces the air within the channels 60 displaced due to the heating of first and second conductors 16, 18. This effect is commonly referred to as a "chimney effect."

The air circulating through the channels 60 helps to cool the first and second conductors 16, 18. In particular, the passage of the air over the surfaces of the plates 20 can transfer thermal energy from the plates 20 by convective heat transfer. Moreover, the curved portions 28 increase the overall surface area of the first and second conductors 16, 18, and thereby facilitate additional convective heat transfer from the first and second conductors 16, 18.

The above-described features, by helping to dissipate the heat generated during operation of the connector 10, can facilitate the transmission of greater amounts of power through the connector 10 than would otherwise be possible. The noted features can also help the connector 10 to operate at lower temperatures that would otherwise be possible, potentially improving the reliability and service life of the connector 10, and can potentially reduce the amount of space required to accommodate the connector 10 within an electronic device.

Figure 7:
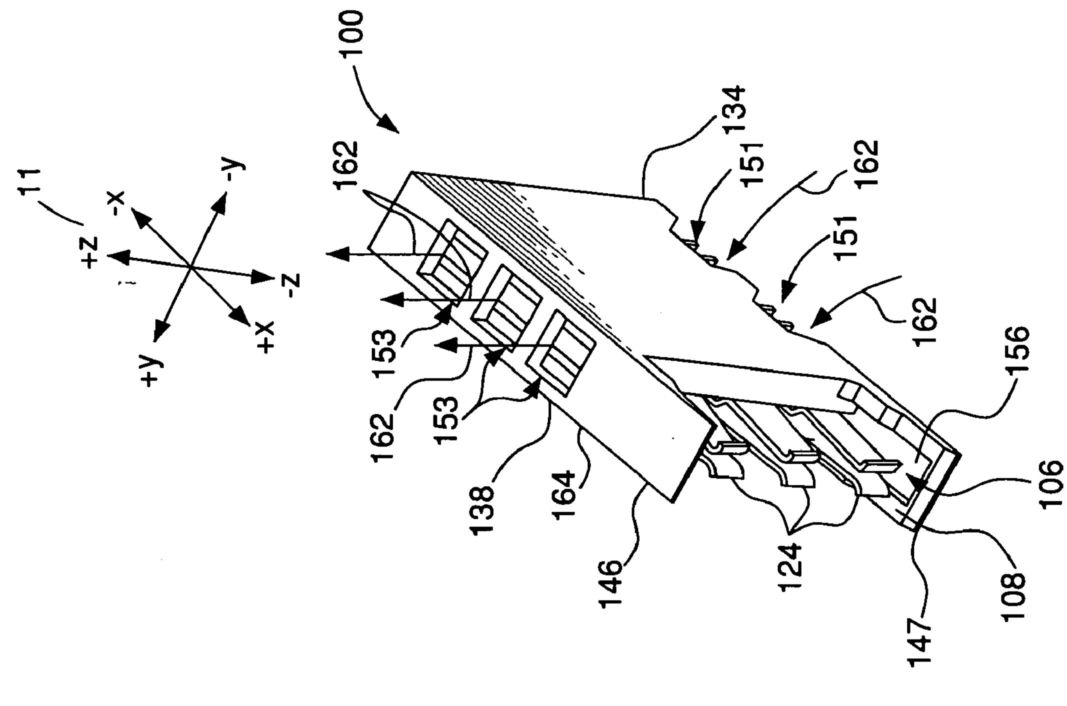
FIG. 7 is a top perspective view of another preferred embodiment of an electrical connector.
Figure 8:
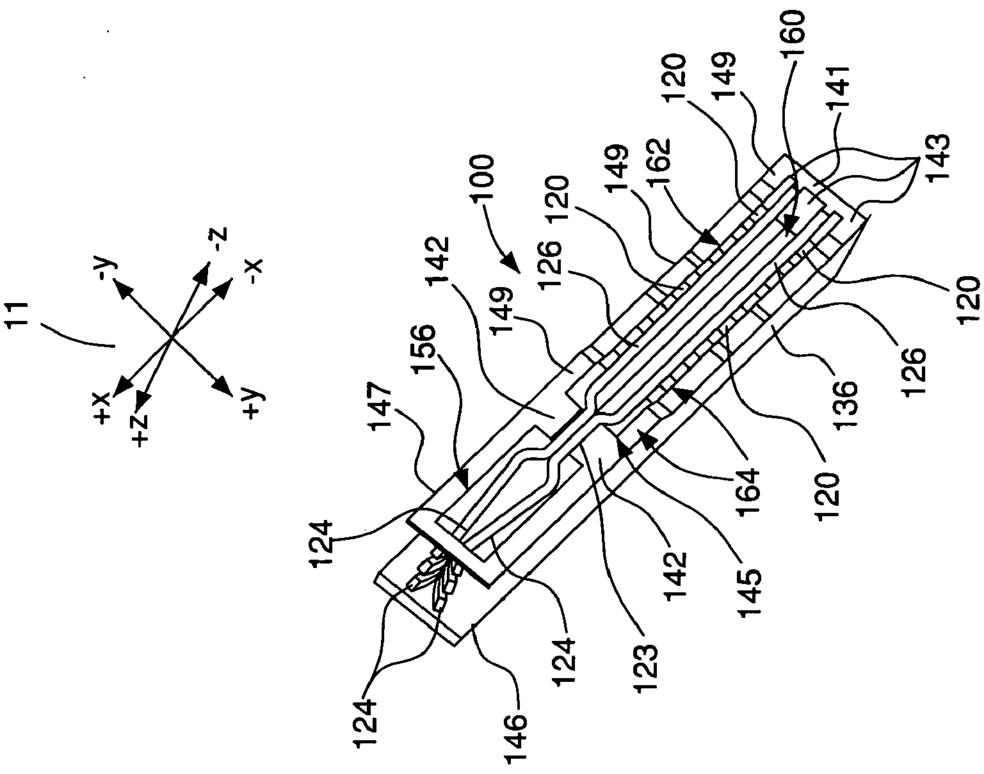
FIG. 8 is a bottom perspective view of the electrical connector shown in FIG. 7.
Figure 9:
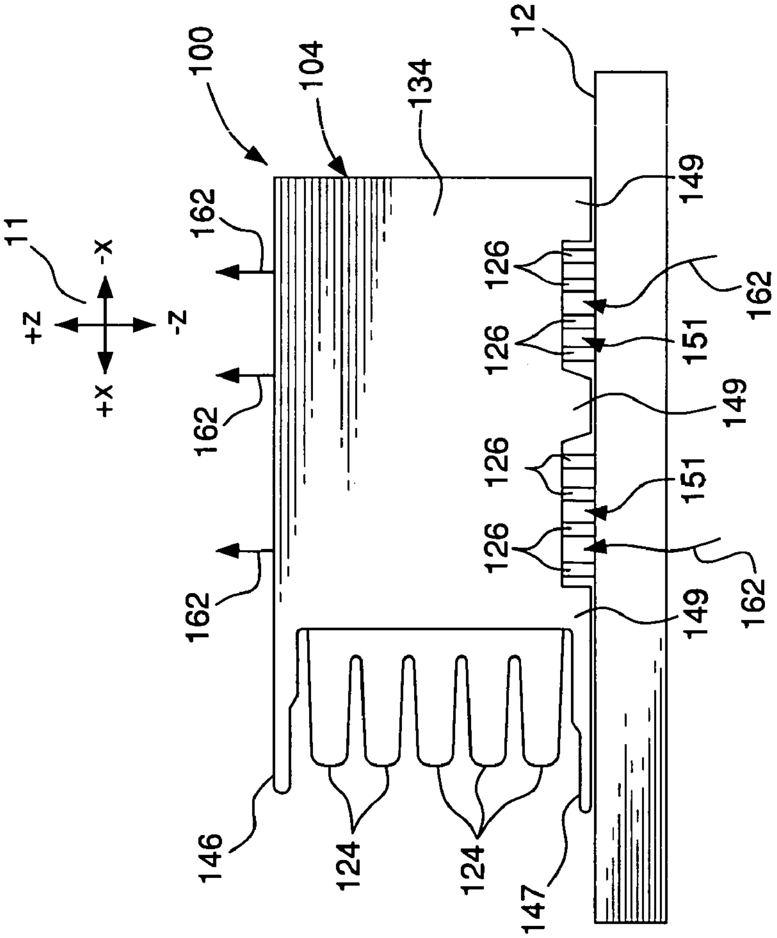
FIG. 9 is a side view of the. electrical connector shown in FIGS. 7 and 8, mounted on a substrate.

FIGS. 7 to 10 depict a preferred embodiment of another electrical connector in the form of an electrical connector 100. The connector 100 can be mounted on the substrate 12, as depicted in FIG. 9. The connector 100 comprises a housing 104. The connector 10 also comprises a first conductor 106 and a second conductor 108 mounted in the housing 104.

The first conductor 106 and the second conductor 108 are substantially identical, with the exception that the first and second conductors 106, 108 are configured in a left and right hand configuration. In other words, the first and second conductors 106, 108 are symmetrically disposed about a vertically-oriented plane passing through the center of the connector 100.

The first and second conductors 106, 108 each comprise a major portion in the form of a substantially flat plate 120. The first and second conductors 106, 108 are mounted in the housing 104 so that the plates 120 of the first and second conductors 106, 108 are spaced apart, as depicted in FIG. 8.

Figure 10:
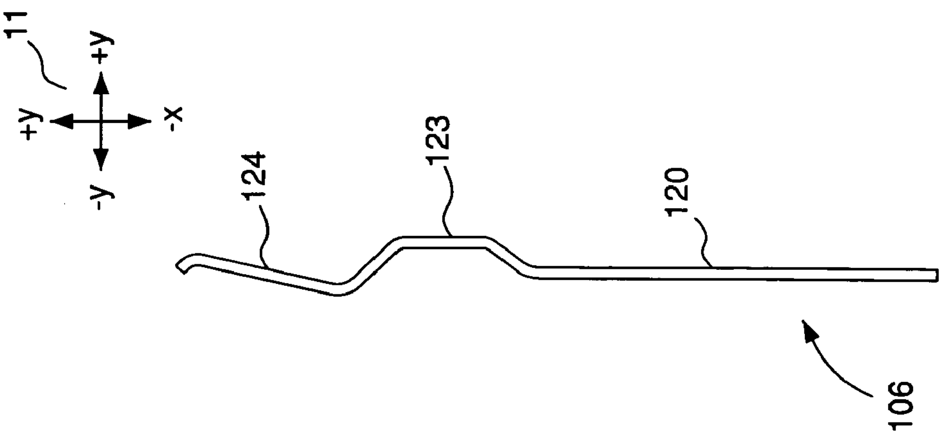
FIG. 10 is a top view of a conductor of the electrical connector shown in FIGS. 7-9.

The first and second conductors 106, 108 each comprise an intermediate member 123 that adjoins a forward edge of the corresponding plate 120. The intermediate members 123 each include a substantially s-shaped portion that causes the remainder of the intermediate member 123 to neck inward, toward the center of the connector 10, as shown in FIGS. 8 and 10.

The first and second conductors 106, 108 also comprise a plurality of contact beams 124 that extend from the corresponding intermediate members 123. The contact beams 124 can mate with a contact, such as a contact blade, of another electrical device such as a second electrical connector (not shown). Alternative embodiments of the first and second conductors 106, 108 can be formed without the intermediate members 123, so that the contact beams 124 extend directly from the corresponding plates 120.

Each of the first and second conductors 106, 108 also comprises a plurality of solder tails 126 extending from a second, or bottom edge of the corresponding plate 120, for mounting the connector 100 on the substrate 12. Alternative embodiments can include press-fit, or other types of tails in lieu of the solder tails 126.

The first and second conductors 106, 108 can conduct power between the substrate 12 and the second electrical connector when the connector 100 is mounted on the substrate 12 and mated with the second electrical connector.

The housing 104 is formed from an electrically-insulating material such as plastic. The housing 104 includes a first side portion 134, a second side portion 136, a top portion 138, and a rearward portion 141. The top portion 138 adjoins the first and second side portions 134, 136. The rearward portion 141 adjoins each of the first and second side portions 134, 136, and the top portion 138. The first side portion 134, second side portion 136, top portion 138, and rear portion 141 define a cavity 145 within the housing 104. The bottom of the housing 104 is open, as shown in FIG. 8.

The housing 104 also includes an upper mating shroud 146 extending from the top portion 138, and a lower mating shroud 147 extending from the bottom portion 140. The lower mating shroud 147 has a cutout 156 formed therein, as shown in FIGS. 7 and 8.

The housing 104 further includes standoffs 149 that cause the bottom of the first and second side portions 134, 136 and the rear portion 141 to be spaced from the substrate 12, as shown in FIG. 9. In other words, a gap 151 exists between the substrate 12, and the respective lower ends of the first and second side portions 134, 136 and the rear portion 141. The bottom of the housing 104 is open, as noted above. The cavity 145 therefore adjoins the gap 151.

The top portion 138 has three substantially square openings 153 formed therein, as shown in FIG. 7. Alternative embodiments can be formed with more or less than three of the openings 153. Moreover, the openings 153 can have a shape other than square in alternative embodiments.

The first and second conductors 106, 108 are inserted into the housing 104 from the bottom thereof, i.e., the first and second conductors 106, 108 are inserted into the housing 104 in the "+z" direction. The cutout 156 in the lower mating shroud 147 accommodates the contact beams 124 as the first and second conductors 106, 108 are inserted.

The plates 120 of the first and second conductors 106, 108 become disposed in the cavity 145 as the first and second conductors 106, 108 are inserted into the housing 104. The first conductor 106 is spaced from the first side portion 134 of the housing 104, and the second conductor 108 is spaced from the second side portion 136 when the first and second contacts are fully inserted in the housing 104, as shown in FIG. 8.

The housing 104 includes retaining features 142, 143 that support and restrain the first and second conductors 106, 108, as shown in FIG. 8. In particular, the retaining features 142 grasp the intermediate members 123 of the first and second contacts 106, 108 as the first and second contacts 106, 108 are inserted into the housing 104. The retaining features 143 grasp the rearward ends of the plates 120 of the first and second contacts 106, 108 as the first and second contacts 106, 108 are inserted into the housing 104.

The solder tails 126 extend downward from the housing 104 when the first and second conductors 106, 108 are positioned within the housing 104, as shown in FIGS. 7 and 9. The solder tails 126 are received in through holes formed in the substrate 12, and establish electrical contact between the connector 100 and the substrate 12.

The connector 100 includes features that can facilitate circulation of air through the connector 100. These features thereby help to cool the connector 100, and prevent heated air from being trapped within the connector 100. In particular, the plates 120 define a first channel 160 therebetween. Moreover, the plate 120 of the first conductor 106 and the first side portion 134 of the housing 104 define a second channel 162 therebetween, and the plate 120 of the second conductor 108 and the second side portion 136 of the housing 104 define a third channel 164 therebetween, as shown in FIG. 8.

The first, second, and third channels 160, 162, 164 each adjoin the openings 153 in the top portion 138 of the housing 104. Moreover, the first, second, and third channels 160, 162, 164 each extend to the bottom of the housing 104, and therefore adjoin the gap 151 that exists between the substrate 12, and the respective lower ends of the first and second side portions 134, 136 and the rear portion 141 when the connector 100 is mounted on the substrate 12. The first, second, and third channels 160, 162, 164 thus permit air to circulate between the gap 151, and the openings 153 in the top portion 138.

The first and second contacts 106, 108 are supported by the retaining features 142, 143, as noted above. The connector 100 therefore does not require horizontal support ribs or similar structure that provides lateral restraint by engaging the first and second conductors 104, 106 at or near the mid-points of the plates 120. This configuration permits the use of features, such as the first, second, and third channels 160, 162, 164, that form a substantially unobstructed airflow path extending between the top 138 of the housing 104, and the bottom of the cavity 145.

The first, second, and third channels 160, 162, 164, in conjunction with the openings 153 in the top portion 138 of the housing 104, facilitate circulation of air through the connector 100. In particular, the first, second, and third channels 160, 162, 164 adjoin the openings 153. Air therefore can pass into or out of the first, second, and third channels 160, 162, 164 byway of the openings 153.

The bottom of the cavity 145 is open, as noted above. This arrangement permits air to flow into or out of the first, second, and third channels 160, 162, 164, to or from the gap 151 between the housing 104 and the substrate 12. In other words, the gap 151 and the open configuration of the bottom of the housing 104 provide a substantially unobstructed path for air to enter or exit the bottom of each of the first, second, and third channels 160, 162, 164.

During operation of the connector 100, the first and second conductors 106, 108 are heated by the passage of power therethrough. The first channel 160 is bounded by the plates 120 of both the first and second conductors 106, 108. The second channel 162 is bounded by the plate 120 of the first conductor 106, and the third channel 164 is bounded by the plate 120 of the second conductor 108. The heating of the plates 120 during operation of the connector 100 therefore heats the air within the first, second, and third channels 160, 162, 164.

The heating of the air within the first, second, and third channels 160, 162, 164 is believed to induce airflow through the connector 100. The airflow pattern is denoted diagrammatically by the arrows 162 in the figures. It should be noted that the arrows 162 are included for illustrative purposes only, and are not intended to fully represent the relatively complex airflow patterns that may actually exist in and around the connector 100.

As shown in FIGS. 7 and 9, the air heated by the first and second conductors 106, 108 is believed to rise within the first, second, and third channels 160, 162, 164. The rising air can exit the first, second, and third channels 160, 162, 164 by way of the openings 153 in the top portion 138 of the housing 104. Relatively cool ambient air can enter the first, second, and third channels 160, 162, 164 by way of the gap 151 and the bottom of the housing 104, replacing the air within the first, second, and third channels 160, 162, 164 displaced due to the heating of first and second conductors 106, 108.

The air circulating through the first, second, and third channels 160, 162, 164 helps to cool the first and second conductors 106, 108. In particular, the passage of the air over the plates 120 can transfer thermal energy from the plates 120 by convective heat transfer, as discussed above in relation to the connector 10.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims. For example, the principles of the invention can be applied to connectors in which electrically-conductive blades are used in lieu of the conductors 16, 18 or the conductors 106, 108.

What is claimed:

1. An electrical connector, comprising:

an electrical conductor for transmitting electrical power, the electrical conductor comprising a plate and a contact beam in electrical contact with the plate; and a housing, wherein: the electrical conductor is mounted in the housing so that the housing and the electrical conductor define a channel for circulating airflow through the housing and along a surface of the electrical conductor; the electrical connector can be mounted on a substrate; the housing has standoffs for spacing a bottom of the housing from the substrate so that a gap is formed between the bottom of the housing and the substrate; the gap is in fluid communication with the channel; the gap forms an opening in a side of the housing; the electrical conductor has a curved portion in electrical contact with the plate and having slots formed therein that permit air to enter or exit the channel; an edge of the curved portion extends in a direction transverse to the plate; and the housing has a groove formed therein for receiving the edge of the curved portion so that the electrical conductor is retained in the housing.

2. The electrical connector of claim 1, wherein the electrical conductor comprises a tail for establishing electrical contact between the electrical connector and a substrate, the tail extends from a bottom of the housing, and the electrical conductor can be inserted into the housing from the bottom of the housing.

3. The electrical connector of claim 2, wherein the housing comprises a mating shroud, the mating shroud having a cutout formed therein so that contact beams of the electrical conductor can pass through the mating shroud as the electrical conductor is inserted into the housing.

4. The electrical connector of claim 1, wherein the plate of the electrical conductor is disposed in a cavity formed in the housing so that the plate and the housing define the channel, and the plate is exposed to air circulating through the channel in response to heating of the electrical conductor whereby the plate is cooled by convective heat transfer.

5. The electrical connector of claim 4, wherein the housing further comprises retaining features located proximate a forward and a rearward end of the cavity for retaining the electrical conductor.

6. The electrical connector of claim 5, wherein the electrical conductor further comprises an intermediate portion adjoining the contact beam and a forward end of the plate, and the retaining features grasp the intermediate portion and a rearward end of the plate.

7. The electrical connector of claim 1, wherein a top portion of the housing has an opening formed therein and adjoining the channel.

8. The electrical connector of claim 1, wherein air can circulate through the gap, the channel, and the opening in the top portion of the housing in response to heating of the electrical conductor.

9. The electrical connector of claim 1, wherein the electrical conductor comprises a first and a second electrical conductor, the first and the second electrical conductors being mounted in the housing so that the first electrical conductor is spaced from the second electrical conductor and the first and the second electrical conductors define the channel.

10. The electrical connector of claim 9, wherein the housing and the electrical conductor define three of the channels, the first of the channels being defined by the first and the second electrical conductors, the second of the channels being defined by the housing and the first electrical conductor, and the third of the channels being defined by the housing and the second electrical conductor.

11. The electrical connector of claim 1, wherein the electrical conductor comprises a first and a second electrical conductor, and the housing and the electrical conductor define two of the channels, the first of the channels being defined by the first electrical conductor and the housing, and the second of the channels being defined by the second electrical conductor and the housing.

12. The electrical connector of claim 1, wherein the electrical conductor comprises a plate, and a tail for establishing electrical contact between the electrical connector and a substrate and extending from a first end of the plate, and the curved portion forms a second end of the plate opposite the first end.

13. The electrical connector of claim 1, wherein:

the housing comprises a bottom portion having an opening formed therein, the opening having a first portion extending in a first direction, and a second portion extending in a second direction substantially perpendicular to the first direction and being in fluid communication with the channel, and the electrical conductor comprises a tail for establishing electrical contact between the electrical connector and a substrate, the tail extending through the first portion of the opening in the bottom portion of the housing.

14. An electrical connector, comprising:

a first and a second electrical conductor for conducting electrical power, the first and second electrical conductors each comprising a major portion, a tail extending from the major portion for establishing electrical contact with a substrate, a contact beam extending from the major portion, and a curved portion adjoining the major portion; and a housing defining a cavity for receiving the major portions of the first and second electrical conductors so that the tails of the first and second electrical conductors extend from a bottom of the housing, the curved portion of the first electrical conductor flares outward from the major portion of the first electrical conductor substantially in a first direction so that an edge of the curved portion of the first electrical conductor fits snugly within a first groove formed in the housing so that the first electrical conductor is retained in the housing by contact between the edge of the curved portion of the first electrical conductor and the housing, and the curved portion of the second electrical conductor flares outward from the major portion of the second electrical conductor substantially in a second direction opposite the first direction so that an edge of the curved portion of the second electrical conductor fits snugly within a second groove formed in the housing so that the second electrical conductor is retained in the housing by contact between the edge of the curved portion of the second electrical conductor and the housing, wherein the cavity is in fluid communication with the ambient environment by way of openings defined in the bottom and a top of the housing so that ambient air can circulate over the major portions of the first and second electrical conductors in response to heating of the electrical conductor.

15. The electrical connector of claim 14, wherein the housing includes retaining features that retain the first and second electrical conductors so that the major portions of the first and second electrical conductors and the housing define a substantially unobstructed aifflow channel between the bottom and the top of the housing.

16. The electrical connector of claim 15, wherein the retaining features comprise grooves formed in the housing proximate the top of the housing for receiving the edge of each of the curved portions.

17. The electrical connector of claim 15, wherein the first and second electrical conductors are spaced apart so that the first and second electrical conductors define a first of the aifflow channels, the housing and the first electrical conductor define a second of the airflow channels, and the housing and the second electrical conductor define a third of the aifflow channels.

18. The electrical connector of claim 14, wherein the first and second electrical conductors can be inserted into the housing from the bottom of the housing.

19. The electrical connector of claim 14, wherein the major portion of the first electrical conductor abuts the major portion of the second electrical conductor.

20. The electrical connector of claim 1, wherein the curved portion is separated from the contact beam by at least the plate.

21. The electrical connector of claim 14, wherein the curved portion of the first electrical conductor is separated from the contact beam of the first electrical conductor by at least the major portion of the first electrical conductor; and the curved portion of the second electrical conductor is separated from the contact beam of the second electrical conductor by at least the major portion of the second electrical conductor.

22. The electrical connector of claim 14, wherein an end of the curved portion of the first electrical conductor is transverse to the major portion of the first electrical conductor; and an end of the curved portion of the second electrical conductor is transverse to the major portion of the second electrical conductor.

23. The electrical connector of claim 1, wherein the edge of the curved portion extends in a direction substantially perpendicular to the plate.

* * * * *